United States Patent

Nadeau-Dostie et al.

[11] Patent Number: 6,046,946
[45] Date of Patent: Apr. 4, 2000

[54] METHOD AND APPARATUS FOR TESTING MULTI-PORT MEMORY USING SHADOW READ

[75] Inventors: Benoit Nadeau-Dostie; Jean-François Côté, both of Aylmer, Canada

[73] Assignee: Logic Visions, Inc., San Jose, Calif.

[21] Appl. No.: 09/047,233

[22] Filed: Mar. 25, 1998

Related U.S. Application Data

[63] Continuation of application No. 08/775,856, Dec. 31, 1996, Pat. No. 5,812,469.

[51] Int. Cl.⁷ ..................................................... G11C 7/00
[52] U.S. Cl. ...................................... 365/201; 365/230.05
[58] Field of Search ............................... 365/201, 230.05, 365/189.04, 220, 221; 371/21.1, 21.2

[56] References Cited

U.S. PATENT DOCUMENTS

| | | | |
|---|---|---|---|
| 5,566,371 | 10/1996 | Ogawa | 365/230.03 |
| 5,579,322 | 11/1996 | Onodera | 371/22.3 |
| 5,590,087 | 12/1996 | Chung et al. | 365/230.05 |

OTHER PUBLICATIONS

Ad J. van de Goor et al., "Fault Models and Tests for Ring Address Type FIFOs", VLSI Test Symposium (IEEE) Jun. 1994, pp. 300–305.

T. Matsumura, "An Efficient Test Method for Embedded Multi–port RAM with BIST Circuitry", International Test Conference, 1995, pp. 62–67.

B. Nadie–Dostie et al., "Serial Interfacing for Embedded–Memory Testing" IEEE Design and Test of Computers, Apr. 1990, pp. 52–63.

*Primary Examiner*—A. Zarabian
*Attorney, Agent, or Firm*—Skjerven, Morrill MacPherson, Franklin & Friel LLP; Norman R. Klivans

[57] ABSTRACT

A method of and apparatus for testing multi-port memory performs a shadow read to an adjacent memory cell concurrent with a write operation associated with typical read-write testing. In the presence of a bit wire short or a word wired short, the concurrent read of an adjacent memory cell will cause the value of that cell to be corrupted. The corrupted value is then found by the read-write testing. Consequently, the testing takes no longer than read-write testing. In addition, the testing scheme can be modified for memory with read only ports. An embodiment of the apparatus employs and exclusive OR gate on the least significant bit of the test row address line to generate the shadow read address.

21 Claims, 4 Drawing Sheets

METHOD AND APPARATUS FOR TESTING MULTI-PORT MEMORY USING SHADOW READ

This appln. is a con't of Ser. No. 08/775,856 filed Dec. 31, 1996, U.S. Pat. No. 5,812,469.

FIELD OF THE INVENTION

The present invention relates to method and apparatus for testing multi-part memory.

BACKGROUND OF THE INVENTION

A random-access memory (RAM) is an array of memory cells organized in rows and columns. Each memory cell can contain a value of 0 or 1 and is given an address which is usually a concatenation of its row number and column number expressed in binary notation. In order to read or write the contents of a memory cell, its row and column number is applied to the corresponding address decoders which will activate the appropriate row (or word) lines and bit lines. A word line is a wire that allows the connection of a row of memory cells to the bit lines through access transistors. The bit lines carry the actual data values from/to the memory cells to/from the data output/input of the memory. A multi-port memory has several sets of work lines and bit lines that can be addressed independently.

Multi-port memories are very susceptible to two kinds of shorts. Two specific failures are shorts between adjacent work lines from different ports and shorts between bit lines located in the same (or adjacent) column of memory cells but originating from different ports.

Simultaneous read and/or write operations on the various ports can cause errors under specific circumstances. For example, a memory cell could be read correctly from one port only but could fail to return the correct value if accessed from 2 ports at the same time.

A port is said to be selected if it can perform read or write operations during a test.

A port is said to be active if it is used to apply the single-port test algorithm. In the case of Read-write ports, it is possible that only half, ie the Read or the Write portion of this port, is active.

DESCRIPTION OF THE PRIOR ART

There have been several proposals for testing multi-port memory. "serial interfacing for embedded-memory testing", B. Nadeau-Dostie, A. Silburt and V. K. Agarwal, IEEE Design & Test of Computers, April 1990, proposed a method that does not require a modification of the algorithm used to test each port as a single-port, but the memory must be modified to implement an operation called a "shadow write". A shadow write is an attempt to write to a memory cell with the row selector disabled. The powerful write drivers then drivers then drive only the bit lines. If the memory has no faults, the memory cell will not be modified. If, the however, one performs a normal read operation of the same cell from the port under test and a short (of the type just described) exists, the result of the read access is affected (assuming the appropriate data values are applied). Although effective, this method is not applicable in general because very few designers can modify the design of the memory they are using. Even if they can, the design modification required is not trivial and the method does not work for all configurations of multi-port memories.

In "Fault models and tests for ring address type FIFOs", A. J. van de Goor, I. Schanstra, Y. Zorian, VLSI Test Symposium 1996; "An efficient test method for embedded multi-port RAM with BIST circuitry", T. Matsumura, International Test conference 1995, the detection of the shorts is accomplished by providing additional tests where simultaneous read and write operations from different ports are performed. The operations are performed in the same row or same column to detect the faults of interest. However, the additional tests take significantly more time than that required for each port individually and require the two address busses and the two data busses to be controlled/accessible. The BIST implementation of those tests is also costly.

SUMMARY OF THE INVENTION

An object of the present invention is to provide an improved memory testing method and apparatus.

According to the method of the present invention, during the execution of a test algorithm for a port of a memory, read operations are performed on other ports of the memory that are not under test. The "shadow" read operations are performed in the same column of memory cells as the column where the read and write operations required for the teat algorithm are performed.

In accordance with one aspect of the present invention there is provided a method of testing a multi-port memory having a plurality of memory cells and two or more ports, the method comprising the steps of (a) testing each cell in the memory from one of the ports, designated as an active port, using a single-port test algorithm in which a read operation and a write operation are performed in sequence on a cell being tested; (b) concurrently with the write operation, performing a shadow read operation on another cell in the memory from another of the two or more ports, designated as inactive ports; and (c) repeating steps (a) and (b) for each of the ports.

Preferably, the circuitry for applying read/write testing applies testing to a column of the memory and the circuitry for concurrently reading from the second port reads from the same column.

In accordance with another aspect of the present invention, there is provided an apparatus for testing a multi-port memory having a plurality of memory cells and two or more ports for accessing the memory cells, the apparatus comprising circuitry for testing each the cell in the memory in accordance with a conventional single-port test algorithm in which a read operation and a write operation is performed in sequence on a cell being tested; and circuitry for performing a shadow read operation concurrently with the write operation on another cell in the memory from another of the ports.

Preferably, the read/write testing is applied to a column of the memory and the reading from the second port is from the same column.

An advantage of the present invention is allowing testing for the shorts of interest in such a way that the same algorithm used for single-port memories can be used and that the test address and data can be easily generated from a single bus, irrespective of the number of ports, reducing considerably test time and implementation cost.

BRIEF DESCRIPTION OF THE DRAWINGS

The invention will be further understood from the following description with reference to the accompanying drawings in which.

DETAILED DESCRIPTION

Figure 1:
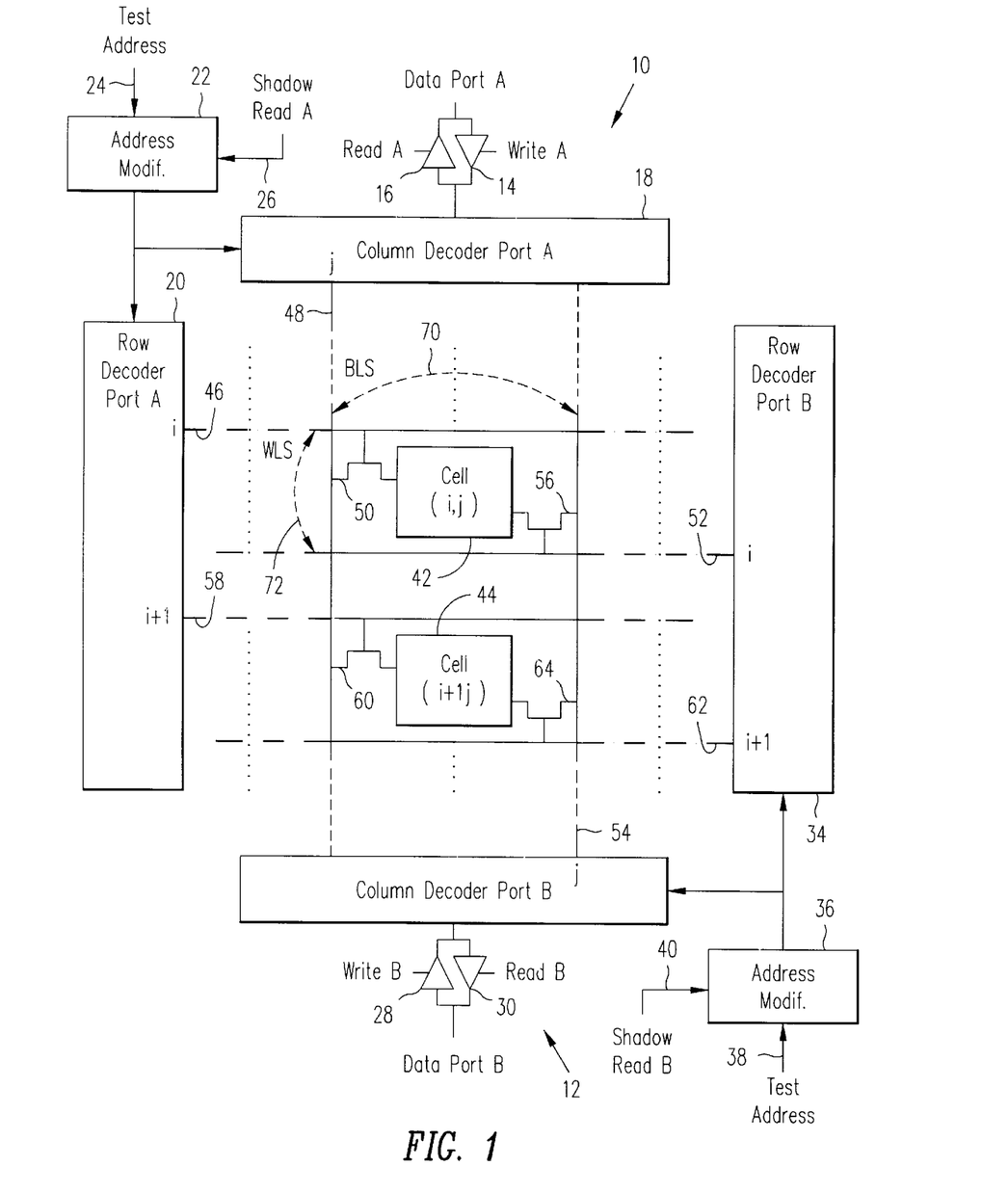
FIG. 1 illustrates a multi-port memory including testing apparatus in accordance with an embodiment of the present invention.

Referring to FIG. 1 there is illustrated a multi-pot memory including testing apparatus in accordance with an embodiment of the present invention. The multi-port memory includes a first data port 10 and a second data port 12. The first data port 10 includes a write driver 14, a read circuit 16, a column decoder 18, a row decoder 20 and an address modifier 22. The address modifier 22 includes input terminals for test address and shadow read enable, 24 and 26 respectively. Similarly, the second data port 12 includes a write driver 28, a read circuit 30, a column decoder 32, a row decoder 34 and an address modifier 36. The address modifier 36 includes input terminals for test address and shadow read enable, 38 and 40 respectively. The memory is representatively shown by two cells, cell(i,j) 42 and cell(i+1,j) 44. The cell(i,j) 42 is accessed from port A 10 by word line 46 and bit line 48 via access transistor 50 and from port B 12 by word the 52 and bit line 54 via access transistor 56. Similarly, the cell(i+1,j) 44 is accessed from port A 10 by word line 58 and bit line 48 via access transistor 60 and from port B 12 by word line 62 and bit line 54 via access transistor 64.

In operation, testing of the memory is applied to one of the ports, while shadow reading of the memory, in accordance with an embodiment of the present invention is applied to the other port. At some point during the test algorithm, a write operation e.g. from port A 10, will cause the logic value of cell(i,j) 42 to be different from cell(i+1j) 44, (i.e., the cell in next row and same column). If, during this write operation of cell(i,j) 42, a read operation of cell(i+1,j) 44 is performed from port B 12, and a short of the kind described herein below is present, the logic value of cell(i+,j) will change to the value being written to cell(i,j). this happens because the strength of the write driver will typically be superior to than of any memory cell. In the case of a bit line short (BLS) 70, the logic value written to cell(i,j) with also be written to cell(i+1,j) via the access transistor 64. In the case of a word line short (WLS) 72, the logic value written to cell(i,j) will also be written to cell(i+1,j) via the access transistor 50, the cell(i,j) itself, the access transistor 56 (activated by the short) and finally the access transistor 64 activated by the shadow read. In the case of a word line short, it is possible that there is a need to slow down the test to guarantee that the new value can be written to cell(i+1,j). The next time cell(i+1,j) will be read from port A during the read/write listing, the erroneous value will be detected. Hence, during the shadow read itself, the value read on port B is not compared with the correct value, resulting in significant savings in terms of circuitry.

Figure 2:
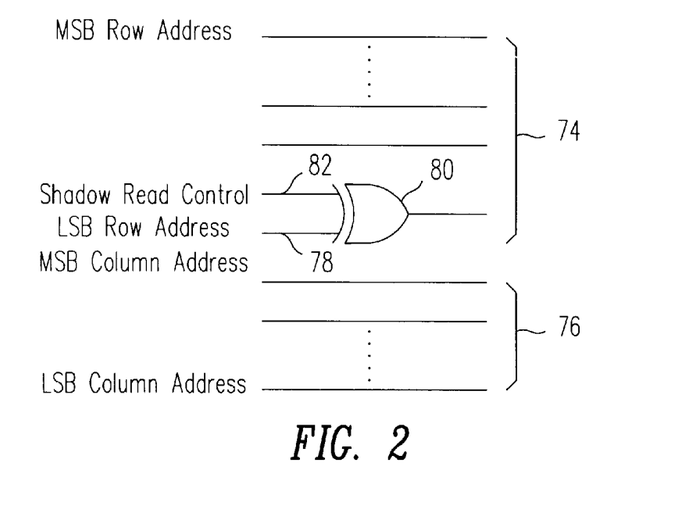
FIG. 2 illustrates detail of the address modifier required for shadow read for the testing apparatus of FIG. 1.

Referring to FIG. 2 there is illustrated detail of the address modifier required for shadow read for the testing apparatus of FIG. 1. Row and column address buses 74 and 76 are shown. A convenient way to generate the address required to perform shadow reads is by inverting the least significant bit 78 of the row address provided to the port under test. This can be done using an exclusive-OR gate 80 controlled to invert the address bit 78 by shadow read control line 82 to perform the read at the right time. Since the number of rows is almost always an even number, the address generated is almost always within the range of the memory. This means that all address bits of all ports can be the same during test, except one, reducing significantly the cost of controlling the address lines.

As would be clear to anyone skilled in the art, any bit of the row address that can be inverted without causing an out-of-range access of the memory may be used to generate the address for shadow read. If the number of row address and column address bits is not known or if it is subject to change in the future because of layout or any other considerations, it preferred to use the most significant bit of the address that can be inverted without causing an out-of-range access of the memory. Another example of where this may be preferred is if word line i from port B can be shorted to work line i+1 from port A.

In the case where all ports of the memory are Read/Write ports, all ports not currently active (i.e., not under test) are in shadow read mode, meaning that their address is always different from the one applied to the port under test. However, it is quite frequent that memories use Read-only and/or Write-only ports when the function of the circuit does not require the full Read/Write capability. In this case, the control of the row address bit inversion is slightly different.

Figure 3:
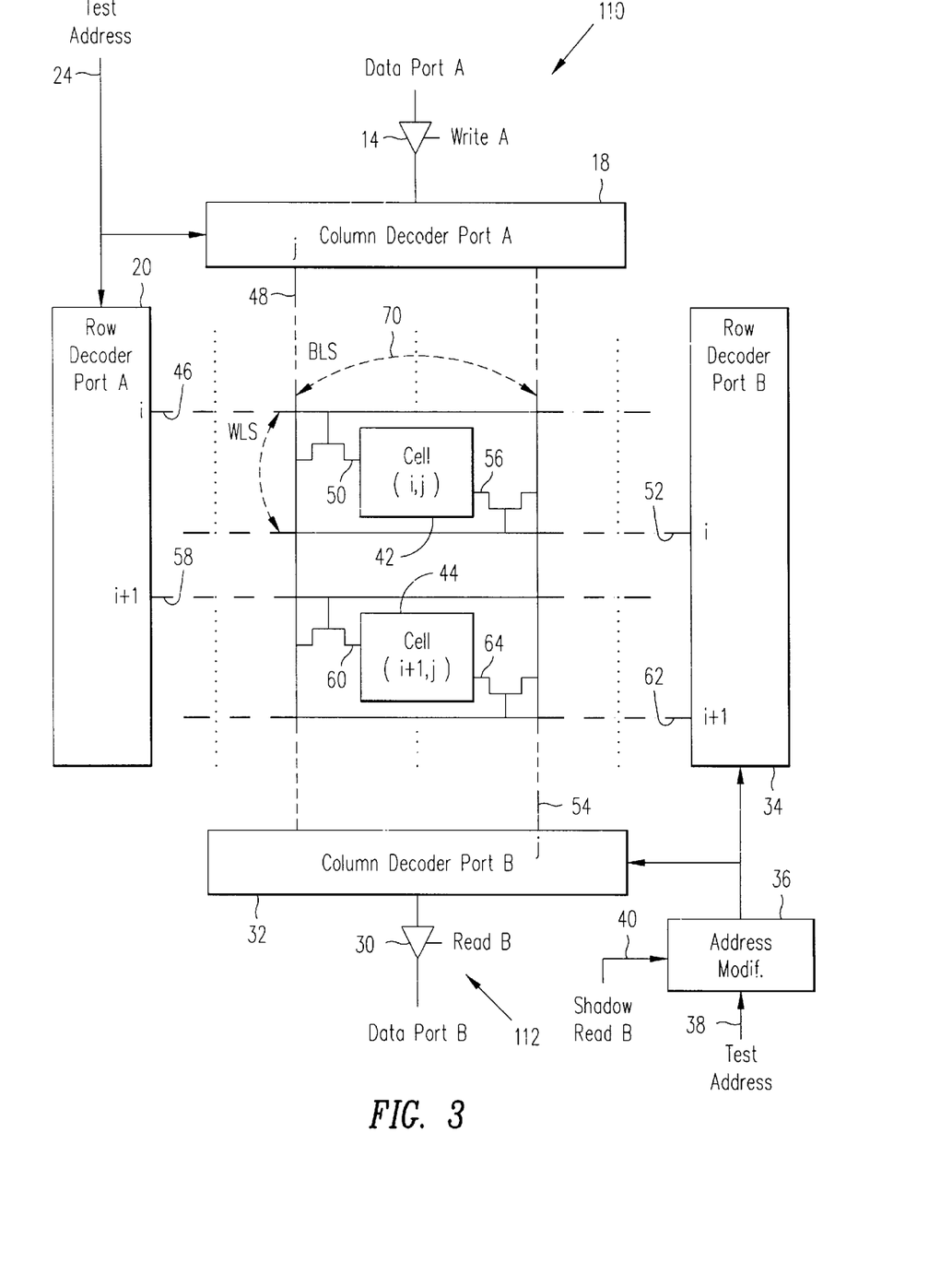
FIG 3 illustrates a memory with a Read-only port and a Write-only port including testing apparatus in accordance with another embodiment of the present invention.

Referring to FIG. 3 there is illustrated a memory having a number of elements the same as in FIG. 1 but with a Read-only port and a Write-only port including testing apparatus in accordance with another embodiment of the present invention; FIG. 3 shows a memory whose port A 110 is a Write-only port and port B 112 is a Read-only port having respectively write driver 14 and read circuit 30. Since both ports are used to apply the conventional memory test algorithm which consists of a series of non-overlapping read and write operations, port B cannot be permanently held in shadow read mode. Instead, the normal test address is applied to the read port B when a read operation is dictated by the algorithm and the modified test address (ie inverted row address bit) when a write operation is performed from port A. It is assumed that the write port can be disabled when it is not required to perform a write by the algorithm (which is usually the case). The detection mechanism of the shorts of interest is the same as for the case where all memory ports are Read/Write ports.

When multiple read-only ports are used, the detection mechanism is slightly different for the bit lines shorts and word line shorts between the read-only ports. These faults can only be uncovered when reading 2 memory cells of the same column at the same time. This will happen when one of the Read-only ports is tested in conjunction with a Write-only port as above or a Read/Write port of which only the write function would be used during this particular phase of the test. All other Read-only and Read/Write ports would be held in the shadow read mode. At some point in the algorithm, the values of the 2 memory cells will be different and will be simultaneously read. Contrary to the previous case, where the strength of the write drivers could be expected to change the state of the memory cell where the shadow read operation was performed, it is not clear which cell will change state because of the instability of the faulty circuit. However, a faulty behaviour should still be detected in most cases. The main inconvenience is the possible difficulty in diagnosing the fault.

Figure 4A:
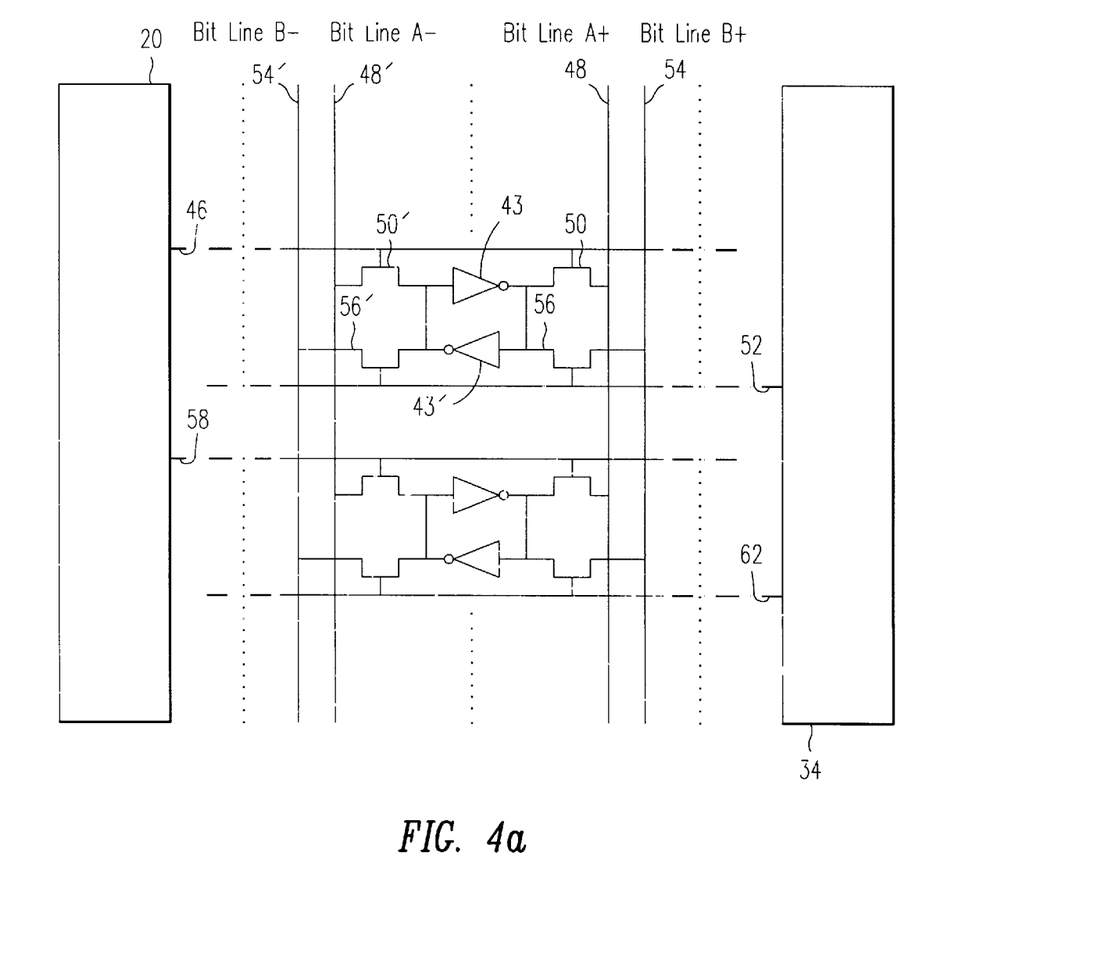
FIGS. 4a and 4b illustrate other memory cell structures for which the testing apparatus is applicable.
Figure 4B:
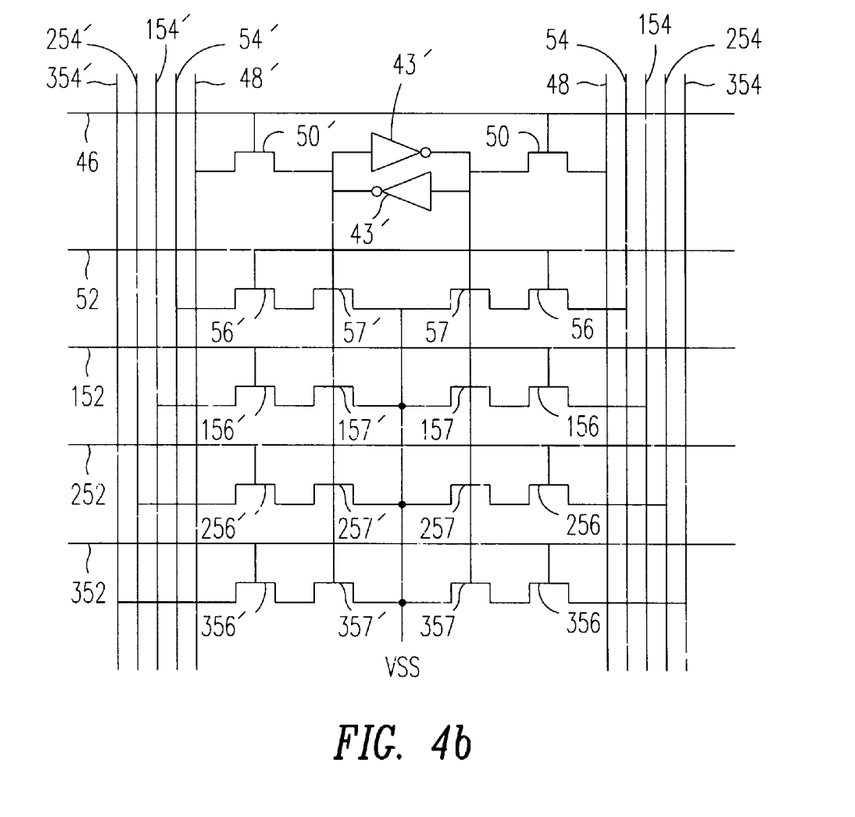

Referring to FIGS. 4a and 4b, there are illustrated other memory cell structures (differing from that of FIG. 1) for which the testing apparatus is applicable.

The technique described to detect the bit line shorts and word line shorts of different ports must be slightly modified if the memory cells have buffered read-only ports as shown in FIG. 4b. In this figure, a single memory cell with one differential write-only port and four differential and buffered read-only ports is represented. The memory cell is connected to bit lines 48 and 48' through access transistors 50 and 50' respectively. As in Fig 4a, bit line 48 carries the positive polarity (+) of the value stored in the memory cell whereas bit line 48' carries the negative polarity (−). Word line 46 control both access transistors 50 and 50' and completes the connections to the first port (e.g. A). The memory cell is also connected to bit lines 54 and 54' through access transistors 56 and 56'. However, transistors 57 and 57' buffer the output of the memory cell such that it is not possible to change the state of the memory cell by accessing it through transistors 56 and 56' activated by word line 52. The same access structure is used for the other 3 read-only ports. Access transistors 156 and 156' connect the memory cell to bit lines 154 and 154' under the control of word line 152. Access transistors 256 and 256' connect the memory cell to bit lines 254 and 254' under the control of word line 252. Access transistors 356 and 356' connect the memory cell to bit lines 354 and 354' under the control of word line 352. Note that it is not necessary to the memory cell to be differential to have its output buffered. This means that transistors 56', 57', 156', 157', 256', 257', 356', 357' would be absent for a cell that does not require a differential access. This cell design WITH BUFFERED OUTPUT is on used the case where a large number of read-only ports are necessary. In such a case, the value read from ports performing shadow reads must be compared to the appropriate value to detect the word line shorts. The time savings are still obtained as well as the area savings due to the use of a single test address bus, however additional circuitry is required to implement the comparison of the data at the output of the port performing the shadow read. This circuitry may be provided on-chip or off-chip. If off-chip it could be under software control. The present embodiment conveniently incorporates the comparative circuitry on-chip. Bit line shorts can still be detected since the short is likely to change the value read on the active read port.

In order to simplify the discussion, it has so far been assumed memory cells with a single access transistor for each port. However, it is very frequent to use memory cells with differential read and write capability for faster access. FIG. 4a shows 2 memory cells with differential access capability. Access transistors 50 and 50' are used to connect to bit line A+ 48 and bit line A− 48' respectively. Bit line A+ and bit line A− are controlled such that the voltage on bit line A+ is greater than the voltage on bit line A− if the value read from or written to a memory cell is a logical 1 and vice-versa for a logical 0. Inverters 43 and 43' constitute the memory cell itself. Access transistors 56 and 56' are used to connect to bit line B+ 54 and line B− 54' respectively. All other reference numbers refer to elements previously described in FIGS. 1 and 3. In the example of this type of memory cell, it is possible that the 2 memory cells need to contain the same logical value in order to detect the shorts of interest instead of the opposite value. This would happen if Bit line A+ were adjacent to Bit line B− and Bit line A− were adjacent to Bit line B+. The method used to detect those shorts is identical to that described so far because any good memory test would ensure that, at some point during the algorithm, any pair of memory cells will have the same value. Only the moment at which the faults would be detected would change. The information about the exact layout of the memory cells would only be needed if ti were necessary to diagnose the problem.

The method in accordance with an embodiment of the present invention is implemented so that:

a) The address bus of the Write-only port or Read-write port with its write port active is made the same as the test address bus (ie non-modified).

b) The address bus of Read-only ports and Read-write ports which are not active is modified to always read a memory location located in the same column but different row than the memory location pointed to by the test address bus.

c) The address bus of the read-only or Read-write port with its read port active is made the same as the test address bus during the read operations required by the algorithm but is modified to read a memory location located in the same column but different tow than the memory location pointed to by the test address bus otherwise.

A memory uses the following control signals: Select, RAS, CAS, Write enable and Read enable. The are used as follows:

Select: When inactive the memory ignores the other inputs to the memory. The memory contents are preserved.

RAS: Row Address Select: enables the row decoder of a dynamic RAM.

CAS: column Address Select: enables the column decoder of a dynamic RAM

The control signals to the memory (select, write enable, read enable, output enable) are controlled to achieve the desired effect. The following each only applies if the particular signal is present on a particular port.

a) Select, RAS and CAS: All read-write ports and read-only ports of a memory must be selected during the test of an of its port. A write-only port is not selected unless it is the active write port.

b) Write enable: The active Read-Write (write half) or write-only port will be enabled to write according to the test algorithm.

c) Read enable: The active read-write port will be enabled to read according to the test algorithm and disabled otherwise. The active read half of a read-write port or the active read-only port will be enabled to read according to the test algorithm and enabled to perform shadow reads the rest of the time. All other read-write or read-only ports will be enabled to continuously perform shadow reads.

d) Output enable: The output enable is normally enabled for the active read port only. However, the output of all read-only ports must be enabled if there is more than one and there is a need to test for word line shorts between word lines of those read-only ports.

The method can also be used for multi-port Read-Only memories. The output of the ports performing shadow reads must be compared to the correct value or compressed in a signature in order to detect word line shorts as it was the case for multiple read-only ports of SRAM. Diagnosis is a little simpler because of the fixed contents of the ROM.

Modification, variations, and adaptation may be made to the embodiments described without departing from the scope of the invention as defined in the claims.

What is claimed is:

1. A method of testing a multi-port memory having a plurality of memory cells and two or more ports, said method comprising:

a) testing each said cell in said memory from one of said ports, designated as an active port, using a single-port test in which a read operation and a write operation are performed in sequence on a cell being tested;

b) concurrently with said write operation, performing a shadow read operation on another cell in said memory from another of said two or more ports, designated as inactive ports; and c) repeating (a) and (b) for each of said ports.

2. A method of testing a multi-port memory as defined in claim 1, said read operation of said test comprising reading a value in a cell and comparing said value with a predetermined value and said shadow read operation comprising merely reading a value in a cell.

3. A method of testing a multi-port memory as defined in claim 1, said another cell being a cell in the same column as said cell being tested.

4. A method of testing a multi-port memory as defined in claim 1, said testing each said cell further including performing said single-port test write operation from a read-write port or a write-only port when said active port is a read-only port.

5. A method of testing a multi-port memory as defined in claim 1, said testing each said cell further including performing said single-port test read operation from a read-write port or a read-only port when said active port is a write-only port.

6. A method of testing a multi-port memory as defined in claim 1, said cells being arranged in rows and columns, said concurrently performing a shadow read operation including shadow reading a cell in a column containing said cell being tested.

7. A method of testing a multi-port memory as defined in claim 1, said cells being arranged in rows and columns, said concurrently performing a shadow read operation including shadow reading an adjacent cell in a column containing said cell being tested.

8. A method of testing a multi-port memory as defined in claim 2, said cells being arranged in rows and columns, said concurrently performing a shadow read operation including shadow reading a cell in said column containing said cell being tested.

9. A method of testing a multi-port memory as defined in claim 2, said cells being arranged in rows and columns, said concurrently performing a shadow read operation including shadow reading a cell adjacent said cell being tested and disposed in a column containing said cell being tested.

10. A method of testing a multi-port memory as defined in claim 1, each said port being a read-write port.

11. A method of testing a multi-port memory having a plurality of memory cells arranged in a plurality of rows and columns and two or more ports, said method comprising:

a) designating one of said ports as an active port and the others of said ports as inactive ports:

b) testing each said cell in said memory from said active port using a single-port test in which a read operation and a write operation are performed in sequence on a cell being tested;

c) concurrently with said write operation, performing a shadow read operation from each of said inactive ports on another cell in said memory disposed in a column containing said cell being tested; and d) designating another of said ports as the active port and repeating (b) and (c) for each of the other of said two or more read/write ports.

12. A method of testing a multi-port memory as defined in claim 11, said shadow reading including the step of generating an address for said another cell by inverting a bit of the row address of the cell being tested and performing said shadow read on the cell at the address generated by said generating.

13. A method of testing a multi-port memory as defined in claim 12, said generating an address for said another cell further including inverting the least significant bit of the row address of said cell being tested.

14. A method of testing a multi-port memory as defined in claim 1, said one port being an active port and other ports being inactive ports, said test providing a test address identifying the location of a cell to be tested, said method further including:

a) applying said test address to an active write-only port or an active read-write port;

b) generating a modified test address and applying said modified test address to inactive read-only ports and inactive read-ports so that said inactive ports read from a memory location in the same column as, but a different row from, the memory location specified by said test address;

c) applying said test address to an active read-only port or an active read-write port with a read port active during the read operations of said test and applying a modified test address to said ports when their respective read ports are inactive so as to read from a memory location located in the same column but different row than the memory location specified by said test address.

15. A method of testing a multi-port memory as defined in claim 1, each port of said memory being responsive to a plurality of control signals including a SELECT signal having active and inactive values, a ROW ADDRESS SELECT signal, a COLUMN ADDRESS SELECT signal, a WRITE ENABLE signal and a READ ENABLE signal, and an OUTPUT ENABLE signal, said control signals being ignored when said SELECT signal is inactive, said ROW ADDRESS SELECT and said COLUMN ADDRESS SELECT signals being operable to enable row and column decoder, respectively, of a dynamic RAM, said method further including, for each port:

a) selecting all read-write ports and read-only ports of said memory during testing of any of said ports by applying the active value of said SELECT signal, said ROW ADDRESS SELECT and SAID COLUMN ADDRESS SELECT signal associated with the active port and deselecting a write-only port by applying the inactive value of said SELECT signal of said write-only port unless said write-only port is the active write port;

b) enabling write operations on the write component of an active read-write port or of a write-only port by applying the active value of said WRITE ENABLE signal associated to this port;

c) when said READ ENABLE signal is enabled;

i) enabling the read component of an active Read-Write port to read during a read operation of said test and disabling said read component during write operations of said test; or ii) enabling the read component of an active Read-Write port or an active Read-Only port to read according to the test and enabling the read component to perform a shadow read when said ports are inactive; and enabling all other read-write or read-only ports to continuously perform shadow reads; and d) enabling said OUTPUT ENABLE signal for an active read-write port and for all read-only ports and, if there is more than one read-only port, testing for word line shorts between word lines of said read-only ports.

16. An apparatus for testing a multi-port memory having a plurality of memory cells and two or more ports for accessing said memory cells, said apparatus comprising:

circuitry for testing each said cell in said memory in accordance with a conventional single-port test in which a read operation and a write operation is performed in sequence on a cell being tested; and circuitry for performing a shadow read operation concurrently with said write operation on another cell in said memory from another of said ports.

17. An apparatus for testing a multi-port memory as defined in claim 16, further including;

means for making one of said ports as an active port for applying said testing to said active port and for making all other ports inactive ports;

means for delivering a test address to each said port;

said circuitry for performing a shadow read operation including means for modifying said test address for inactive ports.

18. An apparatus for testing a multi-port memory as defined in claim 17, said memory being arranged in rows and columns, said means for modifying said test address being operable to modify a bit of the row address of said test address.

19. An apparatus for testing a multi-port memory as defined in claim 17, said means for modifying said test address being operable to invert the least significant bit of the row address of said test address.

20. An apparatus for testing a multi-port memory having a plurality of memory cells arranged in rows and columns and two or more ports for accessing said memory cells, each said port having a row decoder responsive to an input address for selecting a row of said memory and a column decoder port responsive to an input address for selecting a column of said memory; said apparatus comprising:

each read-write port and each write-only port having means for writing to a cell selected by said row and column decoders in specified by said input address, each read-write port and each read-only port having circuit means for reading from a cell selected by said row and column decoders specified by an input address;

means for applying test addresses to each said port for testing each said cell in said memory in accordance with a single-port test which a read operation an/or a write operation is performed on a cell being tested;

an address modifier associated with each said port for receiving a test address and responsive to an enable signal for producing a modified address by modifying a bit of the row address of said test address when a port is not an active port; and circuitry associated with each said port for performing, when said port is inactive and concurrently with a write operation in said single-port test a shadow read operation on a cell in said memory at a location specified by said modified address.

21. An apparatus for testing a multi-port memory as defined in claim 20, said address modifier including an exclusive-OR gate responsive to a shadow read control signal for inverting a row address bit of a test address.

* * * * *

UNITED STATES PATENT AND TRADEMARK OFFICE
CERTIFICATE OF CORRECTION

PATENT NO. : 6,046,946
DATED : April 4, 2000
INVENTOR(S) : Benoit Nadeau-Dostie, et al.

It is certified that error appears in the above-identified patent and that said Letters Patent is hereby corrected as shown below:

On the cover page at [73], delete "Logic Visions, Inc." and insert --LogicVision, Inc.--;
Column 8, line 14, delete "read-ports" and insert --read-write ports--;
Column 10, line 12, delete "an/or" and insert --and/or--.

Signed and Sealed this

Fifth Day of June, 2001

Attest:

Attesting Officer

NICHOLAS P. GODICI

*Acting Director of the United States Patent and Trademark Office*